United States Patent
Chen

(10) Patent No.: US 10,725,089 B1
(45) Date of Patent: Jul. 28, 2020

(54) SEMICONDUCTOR DEVICE AND OPERATING METHOD THEREOF

(71) Applicant: NANYA TECHNOLOGY CORPORATION, New Taipei (TW)

(72) Inventor: Chih-Jen Chen, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/550,299

(22) Filed: Aug. 26, 2019

(51) Int. Cl.
*G01F 3/00* (2006.01)
*G01R 31/26* (2020.01)

(52) U.S. Cl.
CPC ..... *G01R 31/2642* (2013.01); *G01R 31/2621* (2013.01)

(58) Field of Classification Search
CPC ................ G01R 31/2642; G01R 31/6221
See application file for complete search history.

(56) References Cited

U.S. PATENT DOCUMENTS

| | | | | |
|---|---|---|---|---|
| 6,724,214 B2* | 4/2004 | Manna | ................ | G01R 31/129 324/762.02 |
| 6,879,177 B1* | 4/2005 | Bolam | ................ | G01R 31/2879 324/762.09 |
| 6,965,247 B2* | 11/2005 | Nadal Guardia | ......... | G05F 1/46 324/750.3 |
| 7,102,358 B2* | 9/2006 | Keshavarzi | ...... | G01R 19/16571 324/522 |
| 7,271,608 B1* | 9/2007 | Vermeire | ........... | G01R 31/2856 324/750.3 |
| 7,545,161 B2* | 6/2009 | Hsu | ..................... | G01R 31/2621 324/750.3 |
| 7,911,263 B2* | 3/2011 | Guo | ................... | H03K 17/0822 324/522 |
| 8,081,003 B2* | 12/2011 | Pacha | ................ | G01R 31/3181 324/537 |
| 8,564,324 B2* | 10/2013 | Wuidart | .................. | H04L 9/003 324/762.01 |
| 8,653,865 B2* | 2/2014 | Utsuno | ..................... | G06F 1/28 327/143 |
| 9,903,901 B2* | 2/2018 | Jeon | ...................... | G01R 31/025 |
| 2005/0218903 A1* | 10/2005 | Reddy | .............. | G01R 31/31924 324/520 |
| 2019/0196524 A1* | 6/2019 | Cui | ........................... | H03F 1/30 |

* cited by examiner

*Primary Examiner* — Thomas J. Hiltunen
(74) *Attorney, Agent, or Firm* — CKC & Partners Co., LLC

(57) ABSTRACT

A semiconductor includes a first circuit, a second circuit, and a comparison circuit. The first circuit includes a first transistor. The first circuit is configured to output a first output. A second circuit includes a second transistor. The second circuit is configured to output a second output. A comparison circuit is coupled to the first circuit and the second circuit. The comparison circuit is configured to compare the first output and the second output to generate a comparison result, and to output the comparison result. The first transistor decays over a time interval and the first output changes from a first voltage value to a second voltage value over the time interval. The second transistor does not decay over the time interval and the second output of the second circuit maintains to be the third voltage value over the time interval.

8 Claims, 5 Drawing Sheets

SEMICONDUCTOR DEVICE AND OPERATING METHOD THEREOF

BACKGROUND

Technical Field

The present disclosure relates to a semiconductor device and an operating method thereof. More particularly, the present disclosure relates to a semiconductor device and an operating method thereof for detecting a degradation of a transistor.

Description of Related Art

Reliability of the transistors is becoming more and more important, but NBTI (Negative Bias Temperature Instability) and HC (Hot Carrier) cause the transistor's threshold voltage and saturation current to decline. For devices that include transistors, security and reliability issues may be caused when the transistors decay with time.

SUMMARY

An aspect of the present disclosure is to provide a semiconductor device is disclosed. The semiconductor device includes a first circuit, a second circuit, and a comparison circuit. The first circuit includes a first transistor. The first circuit is configured to output a first output. A second circuit includes a second transistor. The second circuit is configured to output a second output. A comparison circuit is coupled to the first circuit and the second circuit. The comparison circuit is configured to compare the first output and the second output to generate a comparison result, and to output the comparison result. The first transistor decays over a time interval and the first output changes from a first voltage value to a second voltage value over the time interval. The second transistor does not decay over the time interval and the second output of the second circuit maintains to be the third voltage value over the time interval.

Another aspect of the present disclosure is to provide an operating method of a semiconductor device. The operating method includes the following operations: outputting a first output by a first circuit; outputting a second output by a second circuit; comparing the first output and the second output to generate a comparison result by a comparison circuit; and outputting the comparison result by the comparison circuit. A first transistor of the first circuit decays over a time interval and the first output changes from a first voltage value to a second voltage value over the time interval. A second transistor of the second circuit does not decay over the time interval and the second output of the second circuit maintains to be the third voltage value over the time interval.

In sum, the embodiments of the present disclosure are to provide a semiconductor device and an operating method thereof, so as to detect the decay degree of the transistors of the circuit. When a decaying amount of the transistors exceeds a decay threshold value, the decayed transistors may be detected timely and easily.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
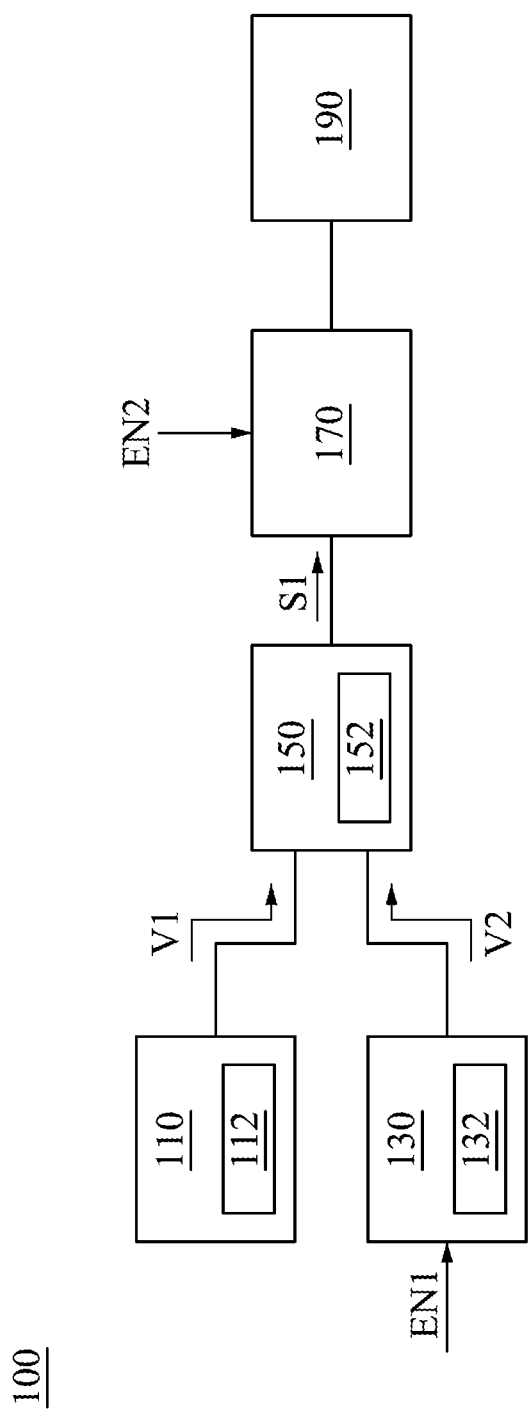
FIG. 1 is a schematic diagram of a semiconductor device according to some embodiments of the present disclosure.

Reference is made to FIG. 1. FIG. 1 is a schematic diagram of a semiconductor device 100 according to some embodiments of the present disclosure. The semiconductor device 100 includes a circuit 110, a circuit 130, and a comparison circuit 150. In the connection relationship, the circuit 110 is coupled to the comparison circuit 150, and the circuit 130 is coupled to the comparison circuit 150. The circuit 110 includes a transistor 112, and the circuit 130 includes a transistor 132. In some embodiments, the specification of the transistor 112 is the same as the specification of the transistor 132.

Figure 2:
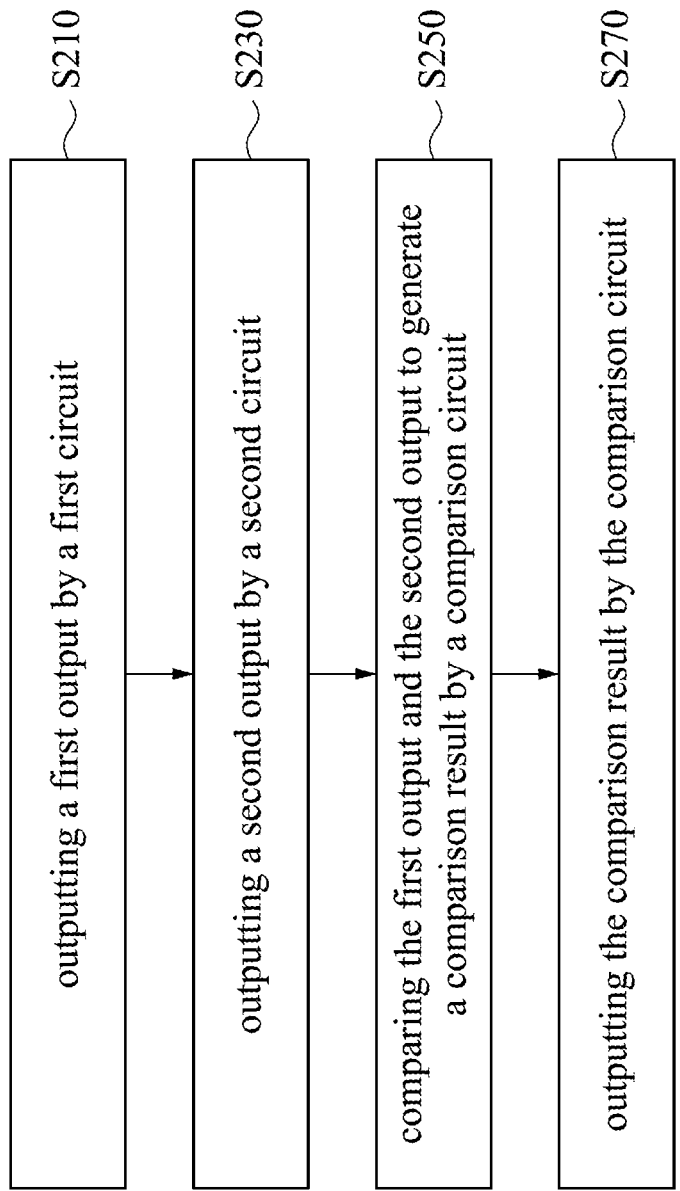
FIG. 2 is a flow chart of an operating method according to some embodiments of the present disclosure.

Reference is made to FIG. 2. For better understanding of the present disclosure, the detailed operation of the semiconductor device 100 will be discussed in accompanying with the embodiments shown in FIG. 2. FIG. 2 is a flowchart illustrating the operating method 200 in accordance with some embodiments of the present disclosure. It should be noted that the operating method 200 can be applied to an electrical device having a structure that is the same as or similar to the structure of the semiconductor device 100 shown in FIG. 1. To simplify the description below, the embodiments shown in FIG. 1 will be used as an example to describe the operating method 200 according to some embodiments of the present disclosure. However, the present disclosure is not limited to application to the embodiments shown in FIG. 1. As shown in FIG. 2, the operating method 200 includes operations 5210 to 5270.

In operation 5210, outputting a first output by a first circuit. In some embodiments, operation 5210 may be operated by the circuit 110 as illustrated in FIG. 1. For example, the circuit 110 outputs an output V1.

In operation 5230, outputting a second output by a second circuit. In some embodiments, operation 5230 may be operated by the circuit 130 as illustrated in FIG. 1. For example, the circuit 130 outputs an output V2.

It should be noted that, in some embodiments, the circuit 110 operates continuously over time, which causes the transistor 112 decays over a time interval and the output V1 changes from a first voltage value to a second voltage value over the time interval. On the other hand, the circuit 130 does not operate continuously. Instead, the circuit 130 operates only when the circuit 130 receives an enable signal EN1 with a value of "1". In some embodiments, the enable signal EN1 with a value of "1" is transferred to the circuit 130 only when a detection operation is performed. Therefore, the transistor 132 does not decay over the time interval and the output V2 maintains to be the third voltage value over the time interval. In some embodiments, the time interval is, for example, 10 years, but the embodiments of the present disclosure are not limited thereto.

Furthermore, in some embodiments, the circuit 130 outputs the output V2 according to the enable signal EN1. For example, in some embodiments, when the enable signal EN1 is "1", the circuit 130 operates and outputs the output V2. On the other hand, when the enable signal EN2 is "0", the circuit 130 does not operate and does not output the output V2.

In operation 5250, comparing the first output and the second output to generate a comparison result by a comparison circuit. In some embodiments, operation 5250 may be operated by the comparison circuit 150 as illustrated in FIG. 1. For example, the comparison circuit 150 compares the output V1 and the output V2, and the comparison circuit 150 generates a comparison result S1 according to the output V1 and the output V2.

In some embodiments, assume that over a time interval, the output V1 changes from a first voltage value to a second voltage value, and the output V2 maintains to be a third voltage value over the time interval. If a first difference between the first voltage value and the second voltage value is larger than a second difference between the first voltage value and the third voltage value, the comparison result generated by the comparison circuit 150 is "1". On the other hand, if the first difference is not larger than the second difference, the comparison result generated by the comparison circuit 150 is "0".

In operation 5270, outputting the comparison result by the comparison circuit. In some embodiments, operation 5270 may be operated by the comparison circuit 150 as illustrated in FIG. 1.

In some embodiments, as illustrated in FIG. 1, the comparison circuit 150 comprises a latch circuit 152. In some embodiments, the latch circuit 152 is configured to store the comparison result. In some embodiments, as illustrated in FIG. 1, the semiconductor device 100 further comprises a gate circuit 170, in which the gate circuit 170 is coupled to the comparison circuit 150. The gate circuit 170 receives the enable signal EN2, and the gate circuit 170 transfers the comparison result of the comparison circuit 150 according to the enable signal EN2. In some embodiments, when the enable signal EN2 is "1", the gate circuit 170 transfers the comparison result of the comparison circuit 150 to the output circuit 190. On the other hand, when the enable signal EN2 is "0", the gate circuit 170 does not transfer the comparison result of the comparison circuit 150 to the output circuit 190.

Figure 3:
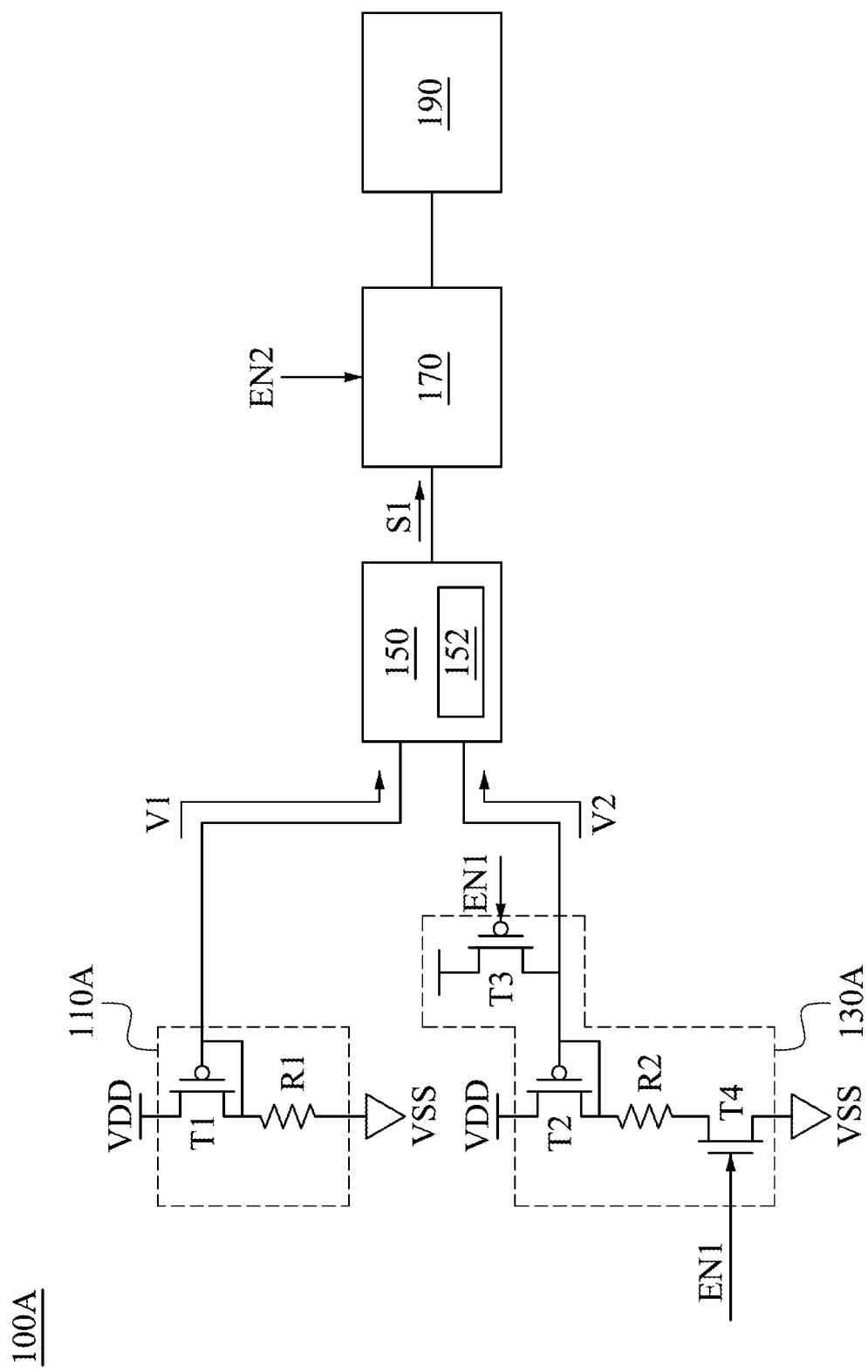
FIG. 3 is a schematic diagram of a semiconductor device according to some embodiments of the present disclosure.

Reference is made to FIG. 3. FIG. 3 is a schematic diagram of a semiconductor device 100A according to some embodiments of the present disclosure. The semiconductor device 100 in FIG. 1 may be represented by the semiconductor device 100A in FIG. 3. As illustrated in FIG. 3, the circuit 110A includes a transistor T1 and a resistor R1. The circuit 110B includes transistors T2 to T4 and a resistor R2. In some embodiments, the transistor T1 and the transistor T2 are the same. As illustrated in FIG. 3, the transistors T1 and T2 are PMOS transistors.

In the connection relationship, the first end of the transistor T1 is coupled to the power source VDD, the second end of the transistor T1 and the control end of the transistor T1 are coupled to the first end of the resistor R1 and the comparison circuit 150. The second end of the resistor R1 is coupled to the power source VSS. The first end of the transistor T2 is coupled to the power source VDD, the second end of the transistor T2 and the control end of the transistor T2 are coupled to the first end of the resistor R2 and the comparison circuit 150. The first end of the transistor T3 is coupled to the power source VDD, the second end of the transistor T3 is coupled to the comparison circuit 150, the control end of the transistor T3 is configured to receive the enable signal EN1. The first end of the transistor T4 is coupled to the second end of the resistor R2, the second end of the transistor T4 is coupled to the power source VSS, and the control end of the transistor T4 is configured to receive the enable signal EN1.

In the operation relationship, since the circuit 110A operates continuously over time, which causes the transistor T1 decays over a time interval and the output V1 changes from a first voltage value to a second voltage value over the time interval. On the other hand, the circuit 130A does not operate continuously. Instead, the circuit 130A operates only when the circuit 130A receives an enable signal EN1 with a value of "1". Therefore, the transistor T2 does not decay over the time interval and the output V2 maintains to be the third voltage value over the time interval.

The transistors T3 and T4 receive the enable signal EN1. When the value of the enable signal EN1 is "1", the transistors T3 and T4 are conducted, and the circuit 130A outputs the output V2.

For example, assume that at first the voltage value of the output V1 is 0.2V. The voltage value of the output V2 maintains to be 0.18V over a time interval, for example, 10 years. After 10 years of operation, the transistor T1 decays and the voltage value of the output V1 changes. The comparison circuit 150 compares the output V1 and the output V2 and generates the comparison result S1 according to the output V1 and the output V2.

If after 10 years, the voltage value of the output V1 is 0.19V, the comparison circuit 150 determines that the output V1 is larger than the output V2, and the comparison result with a value of "0" is generated. On the other hand, if after 10 years, the voltage value of the output V1 is 0.17V, the comparison circuit 150 determines that the output V1 is smaller than the output V2, and the comparison result with a value of "1" is generated.

Figure 4:
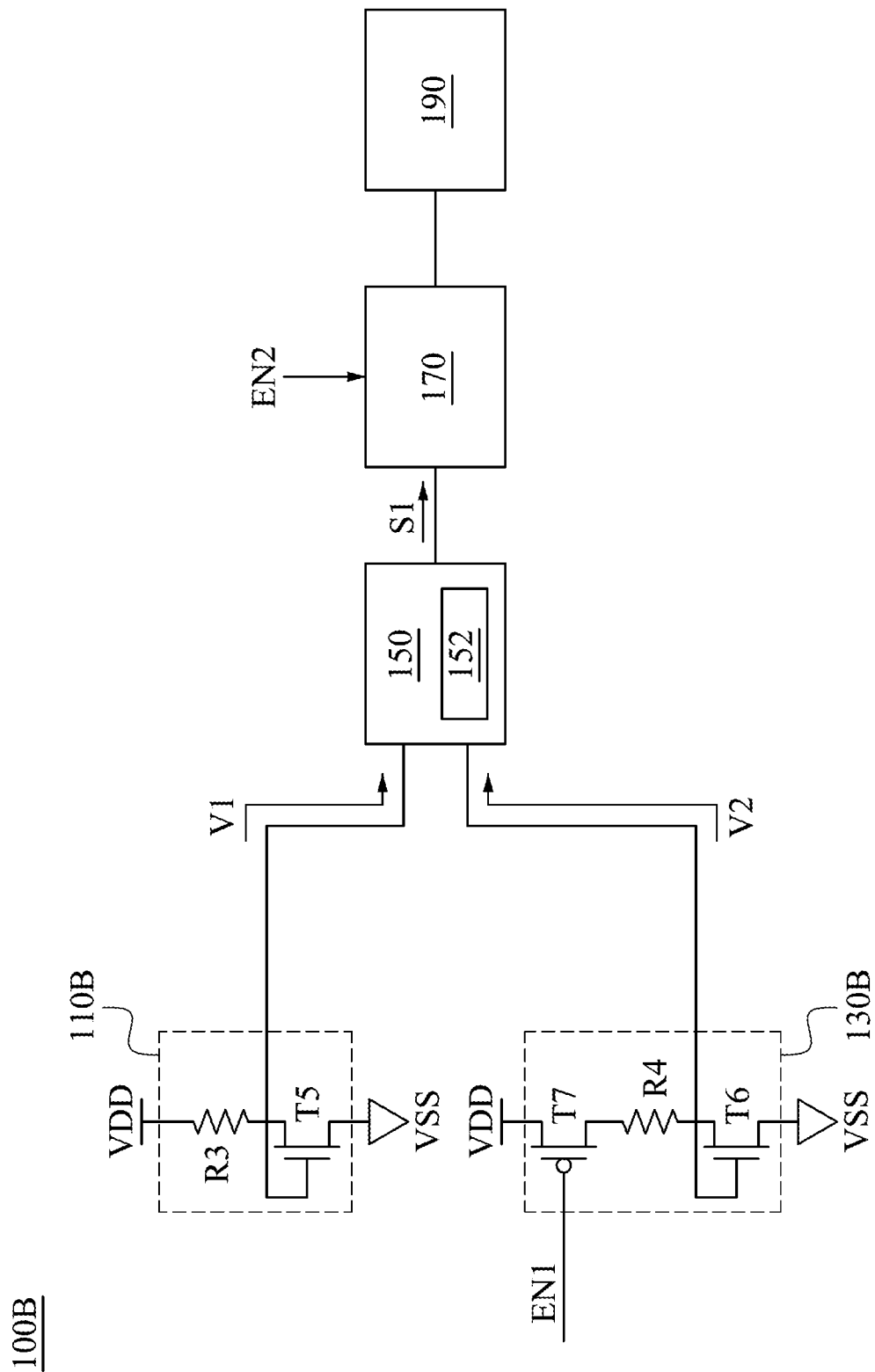
FIG. 4 is a schematic diagram of another semiconductor device according to some embodiments of the present disclosure.

Reference is made to FIG. 4. FIG. 4 is a schematic diagram of a semiconductor device 100B according to some embodiments of the present disclosure. The semiconductor device 100 in FIG. 1 may be represented by the semiconductor 100B in FIG. 4. As illustrated in FIG. 4, the circuit 110B includes a transistor T5 and a resistor R3. The circuit 110B includes transistors T6, T7 and a resistor R4. In some embodiments, the transistor T5 and the transistor T6 are the same. As illustrated in FIG. 4, the transistors T5 and T6 are NMOS transistors.

In the connection relationship, the first end of the transistor T5 is coupled to the power source VSS, the control end of the transistor T5 and the second end of the transistor T5 are couple to the first end of the resistor R3 and the comparison circuit 150. The second end of the resistor R3 is coupled to the power source VDD. The first end of the transistor T6 is coupled to the power source VSS, the control end of the transistor T6 and the second end of the transistor T6 are couple to the first end of the resistor R4 and the comparison circuit 150. The first end of the transistor T7 is coupled to the second end of the resistor R4, the second end of the transistor T7 is coupled to the power source VDD, and the control end of the transistor T7 is configured to receive the enable signal EN1.

In the operation relationship, since the circuit 110B operates continuously over time, which causes the transistor T5 decays over a time interval and the output V1 changes from a first voltage value to a second voltage value over the time interval. On the other hand, the circuit 130B does not operate continuously. Instead, the circuit 130B operates only when the circuit 130B receives an enable signal EN1 with a value of "1". Therefore, the transistor T7 does not decay over the time interval and the output V2 maintains to be the third voltage value over the time interval.

The transistor T7 receives the enable signal EN1. When the value of the enable signal EN1 is "1", the transistor T7 is conducted, and the circuit 130B outputs the output V2.

For example, assume that at first the voltage value of the output V1 is 0.8V. The voltage value of the output V2 maintains to be 0.88V over a time interval, for example, 10 years. After 10 years of operation, the transistor T5 decays and the voltage value of the output V1 changes. The comparison circuit 150 compares the output V1 and the output V2 and generates the comparison result S1 according to the output V1 and the output V2.

If after 10 years, the voltage value of the output V1 is 0.89V, the comparison circuit 150 determines that the output V1 is larger than the output V2, and the comparison result with a value of "1" is generated. On the other hand, if after 10 years, the voltage value of the output V1 is 0.87V, the comparison circuit 150 determines that the output V1 is smaller than the output V2, and the comparison result with a value of "0" is generated.

The third voltage value of the output V2 may be seen as the reference value. The difference between the first voltage value of the output V1 before decaying and the third voltage value of the output V2 may be seen as the threshold difference value. In some embodiments, the third voltage value of the output V2 may be adjusted by adjusting the value of the resistor R2 in FIG. 3 or the resistor R4 in FIG. 4.

When the changing amount of the voltage value of the output V1 is larger than the threshold difference value, it represents that the decaying amount is too large and the transistor of the circuit 110 should be changed.

That is, when a first difference between the first voltage value of the output V1 before decaying and the second voltage value of the output V1 after the time interval is larger than a second difference between the first voltage value and the third voltage value of the output V2, the comparison result is "1". On the other hand, when the first difference is not larger than the second difference, the comparison result is "0". The comparison result of "1" represents that the decaying amount is too large and the transistor of the circuit 110 should be changed.

Figure 5:
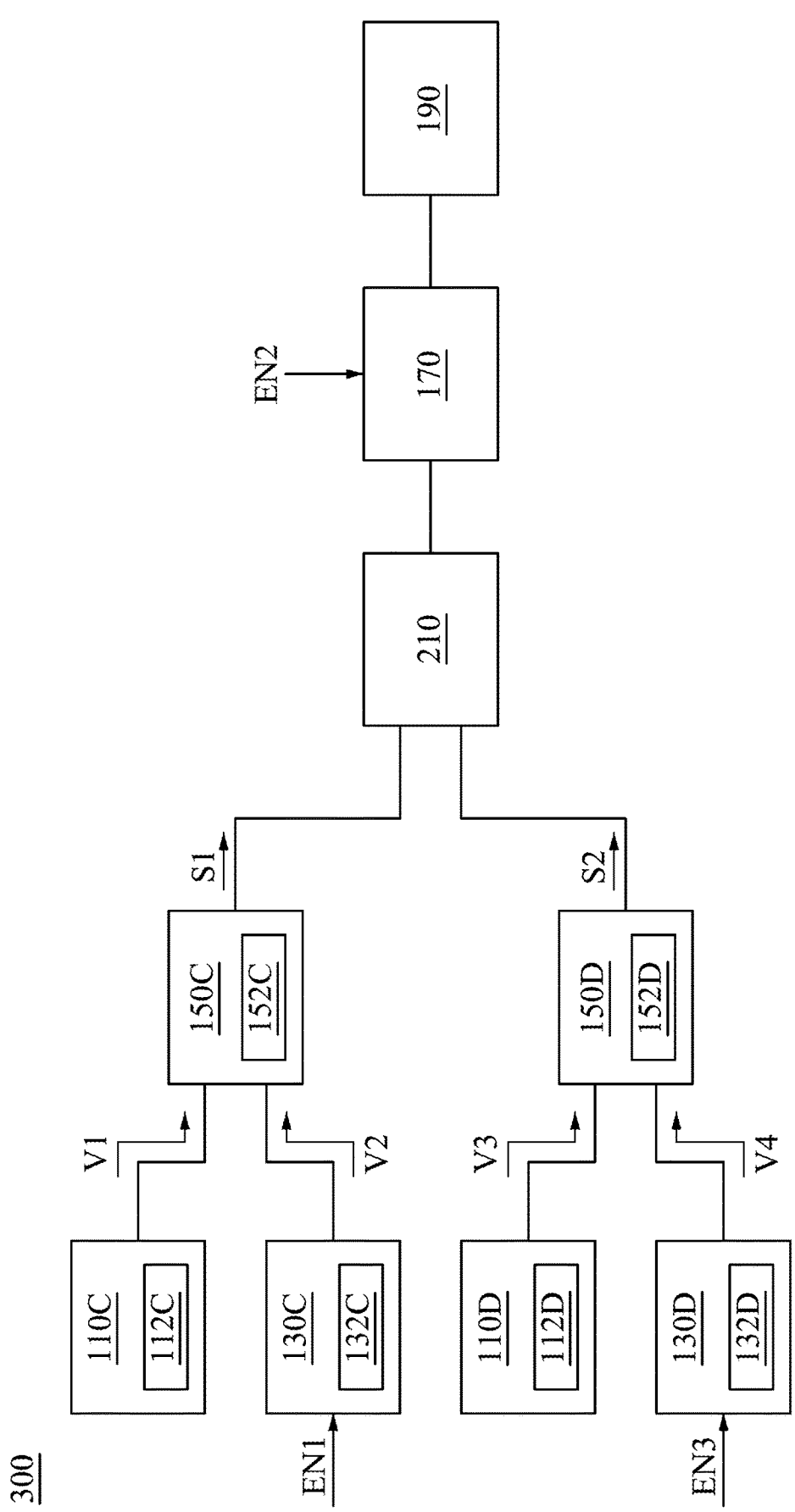
FIG. 5 is a schematic diagram of another semiconductor device according to some embodiments of the present disclosure.

Reference is made to FIG. 5. FIG. 5 is a schematic diagram of another semiconductor device 200 according to some embodiments of the present disclosure. As shown in FIG. 5, the semiconductor device 200 includes a circuit 110C, a circuit 130C, a circuit 110D, and a circuit 130D. The gate circuit 170, the output circuit 190 are the same as those illustrated in FIG. 1. Compared to the semiconductor device 100 as illustrated in FIG. 1, the semiconductor device 200 further comprises an OR circuit 210, and the comparison circuits 150C and 150D. The comparison circuits 150C and 150D are the same as the comparison circuit 150 as illustrate in FIG. 1. The circuit 110C is the same as the circuit 110 as illustrated in FIG. 1, and the circuit 130C is the same as the circuit 130 as illustrated in FIG. 1. The circuit 110C includes a transistor 112C, the circuit 130C includes a transistor 132C, the circuit 110D includes a transistor 112D, and the circuit 130D includes a transistor 132D. The specification of the transistor 112C is the same as the transistor 132C, and the specification of the transistor 112D is the same as the transistor 132D.

In the connection relationship, the circuit 110C and the circuit 130C are coupled to the comparison circuit 150C. The circuit 110D and the circuit 130D are coupled to the comparison circuit 150D. The comparison circuits 150D, 150C are coupled to the OR circuit 210. The OR circuit 210 is coupled to the gate circuit 170. The gate circuit 170 is coupled to the output circuit 190.

The circuits 110C and 110D operates continuously over time, which causes the transistors 112C and 112D decay over a time interval and the voltage value of the output V1 and the voltage value of the output V3 change over the time interval. On the other hand, the circuits 130C and 130D do not operate continuously. Instead, the circuits 130C and 130D operate only when the circuits 130C and 130D receive the enable signals EN1 or EN3 with a value of "1". Therefore, the transistors 132C and 132D do not decay over the time interval and the voltage value of the output V2 and the voltage value of the output V4 maintain over the time interval.

In the operation relationship, the comparison circuit 150C compares the voltage value of the output V1 and the voltage value of the output V2 to generate a comparison result S1. The comparison circuit 150D compares the voltage value of the output V3 and the voltage value of the output V4 to generate a comparison result S2. In some embodiments, the comparison result S1 is stored in the latch circuit 152C of the comparison circuit 150C, and the comparison result S2 is stored in the latch circuit 152D of the comparison circuit 150D.

The OR circuit 210 is configured to control whether the comparison result S1 or the comparison result S2 is transmitted to the output circuit 190 through the gate circuit 170 when the enable signal EN2 is received by the gate circuit 170 with a value of "1".

The semiconductor devices 100/100A/100B mentioned above are for illustrative purposes only, and the embodiments of the present disclosure are not limited thereto. In some embodiments, the circuit 110 may be a bias circuit which operates with a DC voltage. In some embodiments, the circuit 110 may be a high voltage circuit, and the embodiments of the present disclosure are not limited thereto, any circuits with a transistor that decays over time may be implemented with the embodiments of the present disclosure. Furthermore, the time interval and the voltage values mentioning above are for illustrative purposes only, and the embodiments of the present disclosure are not limited thereto. The values of the enable signals EN1 to EN3 are for illustrative purposes only, and the embodiments of the present disclosure are not limited thereto.

In some embodiments, the semiconductor device 100 may be a dynamic random access memory (DRAM) or any other circuits with the functions of data storing and/or data reading or other similar functions.

According to the embodiment of the present disclosure, it is understood that the embodiments of the present disclosure are to provide a semiconductor device and an operating method thereof, so as to detect the decay degree of the transistors of the circuit. When a decaying amount of the transistors exceeds a decay threshold value, the decayed transistors may be detected timely and easily.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A semiconductor device, comprising:
   a first circuit, comprising a first transistor, wherein the first circuit is configured to output a first output;
   a second circuit, comprising a second transistor, wherein the second circuit is configured to output a second output; and
   a comparison circuit, coupled to the first circuit and the second circuit, wherein the comparison circuit is configured to compare the first output and the second output to generate a comparison result, and to output the comparison result;
   wherein the first transistor decays over a time interval, and the first output changes from a first voltage value to a second voltage value over the time interval, wherein the second transistor does not decay over the time interval, and the second output of the second circuit maintains to be the third voltage value over the time interval,
   wherein when a first difference between the first voltage value and the second voltage value is larger than a second difference between the first voltage value and the third voltage value, the comparison result is "1", wherein when the first difference is not larger than the second difference, the comparison result is "0".

2. The semiconductor device of claim 1, wherein the semiconductor device further comprises:
   a gate circuit, coupled to the comparison circuit, wherein the gate circuit is configured to receive an enable signal, and to transfer the comparison result according to the enable signal.

3. The semiconductor device of claim 1, wherein the first transistor is the same as the second transistor.

4. The semiconductor device of claim 1, wherein the second circuit is further configured to receive an enable signal, and to output the second output according to the enable signal.

5. The semiconductor device of claim 1, wherein the comparison circuit comprises:
   a latch circuit, configured to store the comparison result.

6. An operating method of a semiconductor device, comprising:
   outputting a first output by a first circuit;
   outputting a second output by a second circuit;
   comparing the first output and the second output to generate a comparison result by a comparison circuit; and
   outputting the comparison result by the comparison circuit;
   wherein a first transistor of the first circuit decays over a time interval, and the first output changes from a first voltage value to a second voltage value over the time interval, wherein a second transistor of the second circuit does not decay over the time interval, and the second output of the second circuit maintains to be the third voltage value over the time interval,
   wherein when a first difference between the first voltage value and the second voltage value is larger than a second difference between the first voltage value and the third voltage value, the comparison result is "1", wherein when the first difference is not larger than the second difference, the comparison result is "0".

7. The operating method of claim 6, wherein outputting the second output by the second circuit comprises:
   receiving an enable signal by the second circuit; and
   outputting the second output according to the enable signal.

8. The operating method of claim 6, wherein outputting the comparison result comprises:
   storing the comparison result by a latch circuit; and
   outputting the comparison result according to an enable signal.

* * * * *